US006552556B1

(12) United States Patent
Miki

(10) Patent No.: US 6,552,556 B1
(45) Date of Patent: Apr. 22, 2003

(54) PROBER FOR ELECTRICAL MEASUREMENT OF POTENTIALS IN THE INTERIOR OF ULTRA-FINE SEMICONDUCTOR DEVICES, AND METHOD OF MEASURING ELECTRICAL CHARACTERISTICS WITH SAID PROBER

(75) Inventor: Kazushi Miki, Ibaraki (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/538,507

(22) Filed: Mar. 30, 2000

(30) Foreign Application Priority Data

Mar. 31, 1999 (JP) .......................................... 11-093716

(51) Int. Cl.[7] .............................................. G01R 29/12
(52) U.S. Cl. ...................... 324/754; 324/158.1; 324/765
(58) Field of Search ............................ 324/158.1, 73.1, 324/662, 754, 761; 250/306, 307, 310, 311; 73/618, 105

(56) References Cited

U.S. PATENT DOCUMENTS

| 5,267,471 A | * 12/1993 | Abraham et al. ............. 73/105 |
| 5,431,055 A | * 7/1995 | Takata et al. .................. 73/618 |

FOREIGN PATENT DOCUMENTS

| JP | 62-138909 | * 6/1987 |
| JP | 08/160109 | * 6/1996 |
| JP | 09-325079 | * 12/1997 |
| JP | 09-326425 | * 12/1997 |
| JP | 10-056045 | * 2/1998 |

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

A prober for measuring electrical characteristics of a semiconductor device includes a contact device having a contactor with a sharp tip provided at a position close above the position of the semiconductor device at which the electrical characteristics are to be measured, a drive device for driving the contact device in the directions of the x-, y- and z-axes on the nm order, an x- and y-axis drive circuit that supplies drive current to the drive device for driving the contact device in the directions of the x- and y-axes, a signal supply device for supplying a signal between the surface of the semiconductor device and the contact device, a detection device for detecting the signal from the supply device and providing an output signal, a z-axis drive control circuit that supplies drive current to the drive device for driving the contact device in the z-axis direction by using the output signal from the detection device as a feedback input signal, a circuit for providing output to the z-axis drive control circuit of a signal that halts the driving of the contact device in the z-axis direction upon detection of an abnormal signal by the detection device, a switch that connects the contact device to the detection device, a controller that supplies signals for driving the contact device in the x-, y- and z-axis directions, preset tunneling current signals for the z-axis drive control circuit and preset voltage signals for variable DC bias voltage of the detection device, acquires and stores x, y and z positional information for the contact device along with voltage, current and potential information from the detection device, and performs image processing on the information, and a display device that displays the information and image information.

9 Claims, 15 Drawing Sheets

PROBER FOR ELECTRICAL MEASUREMENT OF POTENTIALS IN THE INTERIOR OF ULTRA-FINE SEMICONDUCTOR DEVICES, AND METHOD OF MEASURING ELECTRICAL CHARACTERISTICS WITH SAID PROBER

BACKGROUND OF THE INVENTION

1. Field of the Invention

This invention relates to a prober for directly measuring the electrical characteristics of electronic devices and the method of measuring same, and relates particularly to a prober suited to the measurement of the electrical characteristics of semiconductor devices with a fine structure.

2. Description of the Prior Art

Determining the internal state of operation of a semiconductor device is essential to semiconductor device research and development. The apparatus conventionally used for this kind of determination is a prober for the electrical measurement of semiconductor devices. Such a prober is first positioned and then a certain amount of force is applied with the tips of its probes to make electrical contact between contacts on the semiconductor device and the probes, and thereby the electrical characteristics (current, voltage, etc.) at various locations on the device are measured using two or three probes, or it may be used together with a stage that varies the temperature of the semiconductor device to measure the electron mobility or the like, and thereby determine spatial electrical characteristic information about the interior of the semiconductor device.

Since the aforementioned conventional probers for the electrical measurement of semiconductor devices have probe tips of a size on the $\mu$m order or greater, the contacts at various locations on a semiconductor device with a fine structure are smaller than the size of the probe tips, so it is not possible to measure the electrical characteristics directly. In addition, even with semiconductor devices having design rules of a size of $\mu$m or greater, the probers for electrical measurement do not have drive means for driving the prober in sub-$\mu$m order units, so they are inappropriate as a means of directly measuring the potential distribution within a semiconductor device. Moreover they have a problem in that the contact pressure of the probe tip destroys the contact of the semiconductor device.

For this reason, the electrical measurement of semiconductor devices was performed instead by packaging the semiconductor device for radio-frequency measurement and then the probes were put into contact with electrode contacts that extended out from the semiconductor device. However, as semiconductor devices reach finer geometries, probers for measuring electrical characteristics that directly measure various locations of the semiconductor device have become necessary.

In addition, the effects of the surfaces and interfaces on the internal structure within the semiconductor device are not negligible at the time of measuring the electrical characteristics, but rather the appearance of quantum effects arising from the miniaturization of the semiconductor devices have made the interior electronic structure of the semiconductor devices even more complex. For this reason, parameters such as the potential distribution and the like which are necessary for the design simulation of semiconductor devices cannot be measured with conventional probers, so research and development of fine-geometry semiconductor device technology is in a difficult predicament.

In the design of future fine-geometry semiconductor devices, the direct measurement of electrical characteristics at various locations of a semiconductor device with a probe will be essential to find the size of electrodes or other fabrication errors, and the potential distribution or other parameters necessary for simulation, so that by performing comparative studies of these parameters against the simulation, it is possible to increase the operating speed of semiconductor devices, raise their switching ratios, reduce their power consumption and perform various other kinds of optimization.

For this reason, there is a need for the development of technology that can directly measure the internal potential distribution within fine-geometry semiconductor devices and semiconductor devices, along with the size of electrodes or other fabrication errors and the like.

The present invention came about in consideration of the aforementioned situation and its object is to provide a prober for electrical measurement that is capable of direct measurement of electrical characteristics required for fabrication technologies for fine-geometry semiconductor devices, and also provide a measurement method using said prober.

SUMMARY OF THE INVENTION

In order to achieve the aforementioned objects, the prober for electrical measurement of the present invention comprises: a probe with a sharp tip, drive means for driving said probe in the direction of the x-, y- and z-axes on the nm order, an x- and y-axis drive circuit that supplies drive current to said drive means for driving in the direction of the x- and y-axes, a first electrical circuit for detecting the tunnel current between said probe and the semiconductor device to be measured, a z-axis drive control circuit that supplies drive current to said drive means for driving said probe in the z-axis direction by using the output from said first electrical circuit as feedback input, a second electrical circuit that applies a variable DC bias voltage between said probe and semiconductor device and detects the current and voltage between said probe and semiconductor device, a circuit for providing output to the z-axis drive control circuit of a signal that halts the driving of said probe in the z-axis direction upon the detection of an abnormal increase in the current flowing in said second electrical circuit, a switch that connects said probe to either said first electrical circuit or said second electrical circuit, a controller that supplies signals for driving said probe in the x-, y- and z-axis directions, setting tunneling current signals for the z-axis drive control circuit and setting voltage signals for the variable DC bias voltage of the second electrical circuit, and acquires x, y and z positional information for said probe along with the voltage, current and potential information from the second electrical circuit, and stores and performs image processing on said information, and a display device that displays said information and image information.

As the means of driving the aforementioned probe on the nm order, a piezoelectric element actuator or inchworm drive may be used.

The probe can also be driven to the desired position while using interatomic forces, temperature or light instead of the aforementioned tunnel current to detect the state of contact between the probe and the surface of the semiconductor device.

In addition, the method of measuring electrical characteristics using the aforementioned prober according to the present invention comprises the steps of: causing a sharp probe to scan over the surface of a semiconductor at a distance at which the tunnel current phenomenon occurs and based on the semiconductor surface approach position data thus obtained, accurately positioning said probe at a semiconductor surface approach position corresponding to the desired position on the semiconductor surface, driving said probe lower in the z-axis direction toward the semiconductor surface until an abnormal increase in current flows through said probe, applying a voltage to said probe, and directly measuring the current and voltage at the desired position on the semiconductor device.

The probe can also be driven to the desired position while using interatomic forces, temperature or light instead of the aforementioned tunnel current to detect the state of contact between the probe and the surface of the semiconductor device.

As described above, the present invention uses a conductive probe with a tip radius of not more than 0.02 μm or less as the probe, and by using a drive mechanism that drives the sharp probe to approach a position near the semiconductor device with nm order accuracy until an abnormal increase in the current flowing in the sharp probe is detected, thereby detecting the electrical contact between the sharp probe and the semiconductor surface, it is possible to put a sharp probe into electrical contact with the semiconductor surface without destroying the semiconductor device, thereby directly measuring the electrical characteristic of a specific location on a semiconductor device with a sharp probe and an electrical characteristic measurement circuit.

The other objects and other characteristics of this invention will be further clarified in the following detailed description based on the appended drawings.

BRIEF EXPLANATION OF THE DRAWING

FIG. 11(a) shows the state at the start of operation of the inchworm drive mechanism. FIG. 11(b) shows the state when the drive shaft is clamped with one clamp element. FIG. 11(c) shows the state when the piezoelectric element is extended. FIG. 11(d) shows the state when the drive shaft is clamped with another clamp element. FIG. 11(e) shows the state when the clamping of one clamp element is released. FIG. 11(f) shows the state when the piezoelectric element is compressed and the drive shaft is moved to the left. FIG. 11(g) shows the state when one clamp element is clamped. FIG. 11(h) shows the state when the clamping of the other clamp element is released.

DESCRIPTION OF THE PREFERRED EMBODIMENT

Here follows a detailed description of the basic structure of the prober according to the present invention based on FIGS. 1–7.

Figure 1:
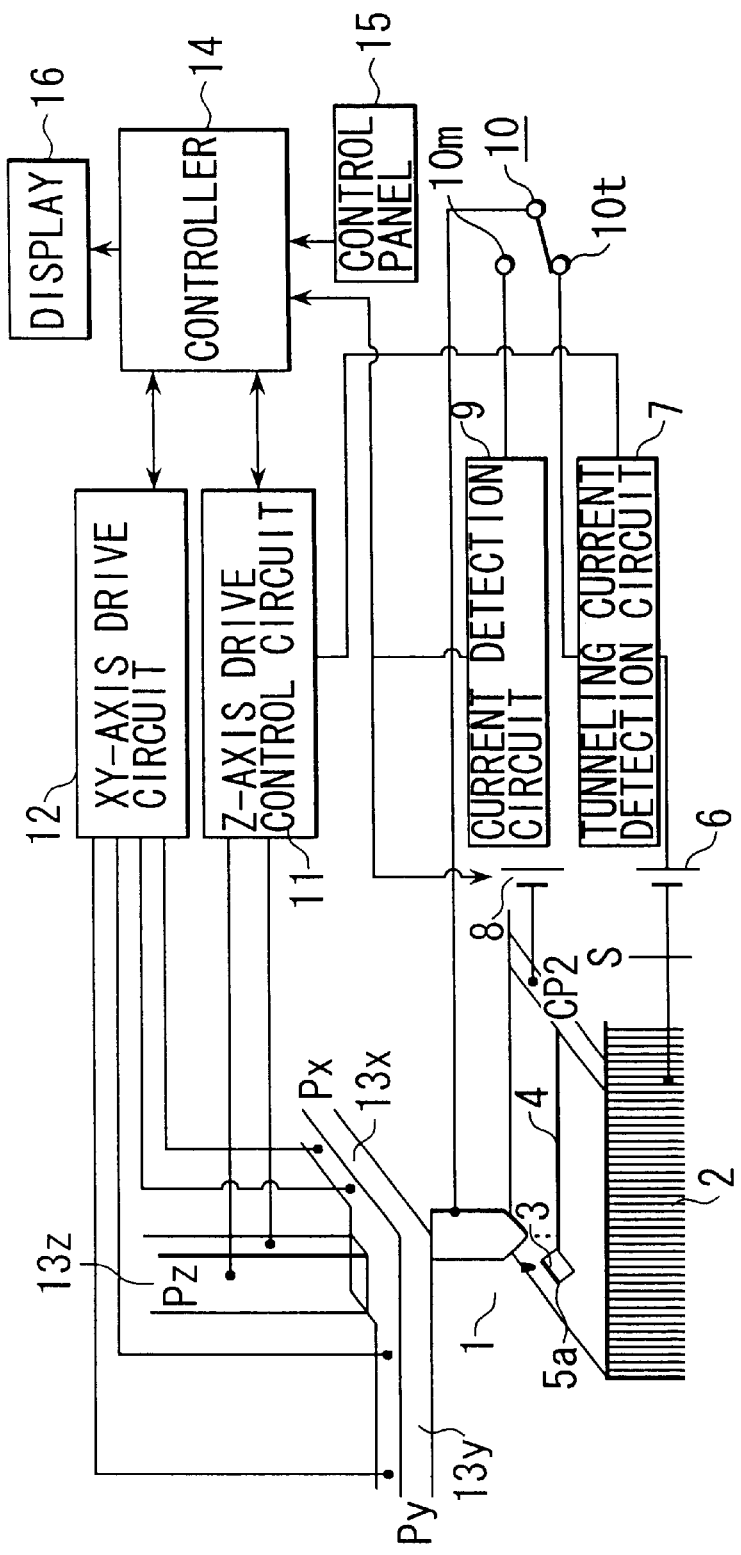
FIG. 1 is a diagram used to explain the position detection mode of the prober according to the present invention.
Figure 2:
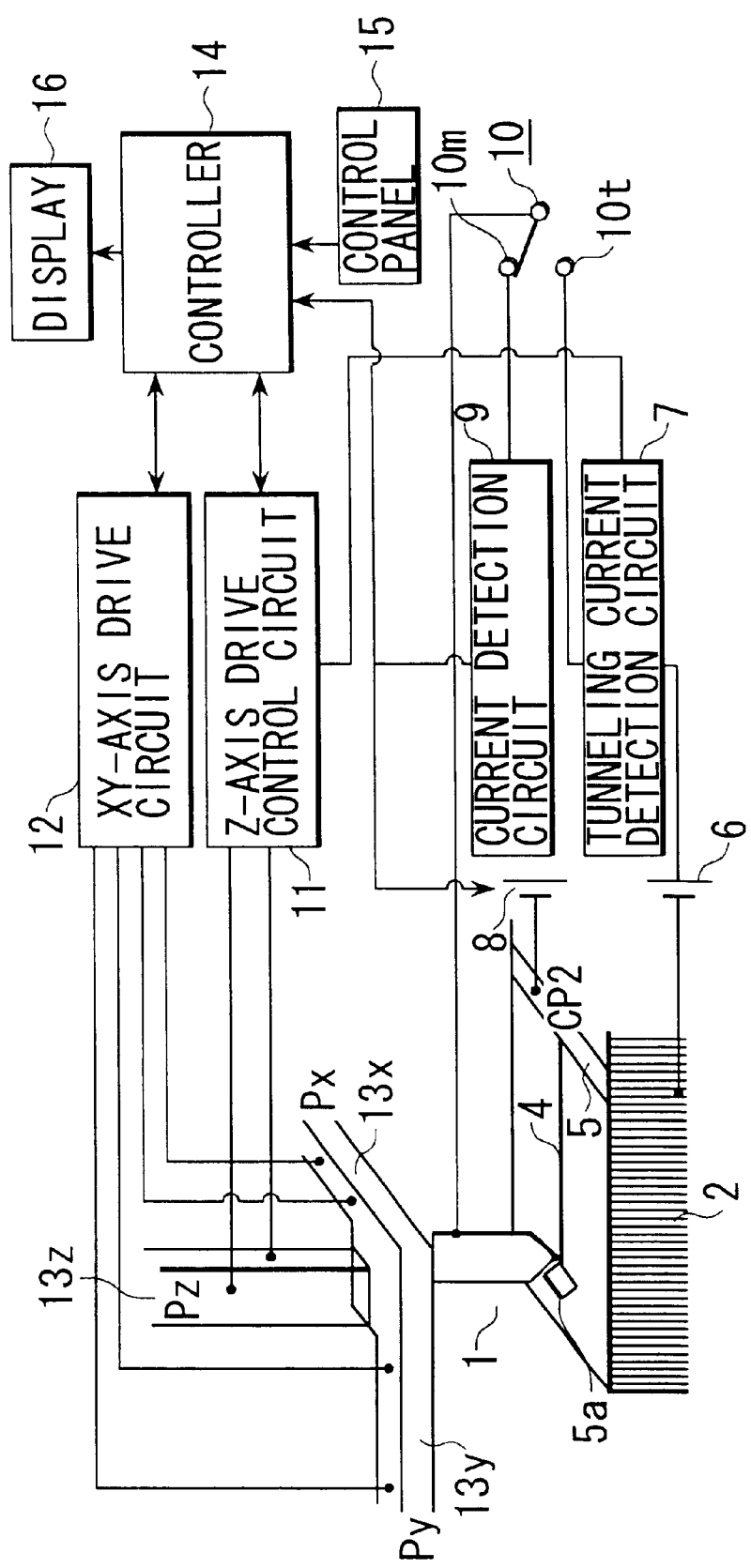
FIG. 2 is a diagram used to explain the measurement mode of the prober of FIG. 1.

FIGS. 1 and 2 show an embodiment of the prober for electrical measurement according to the present invention, using a probe with a tip radius of not more than 0.02 m or less, and utilizing the principle of a scanning tunneling microscope for approach positioning as the drive apparatus for said probe.

Figure 12:
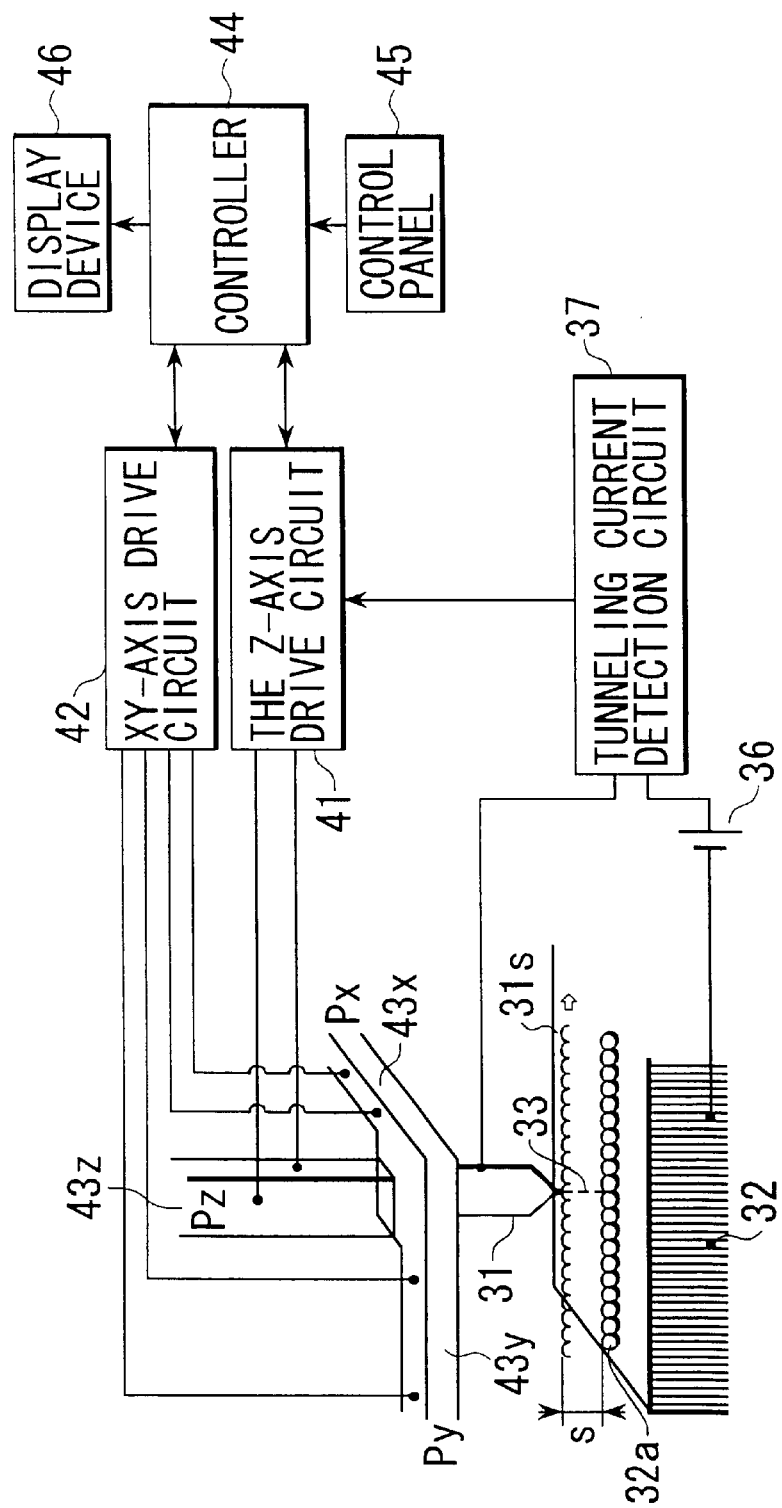
FIG. 12 is an explanatory diagram showing the principle of using the tunnel current to detect positions near the surface of a semiconductor device.

We will first explain the detection of positions near the surface of a semiconductor device utilizing the principle of the aforementioned scanning tunneling microscope (STM). FIG. 12 is a diagram that illustrates this principle. Reference numeral 31 denotes a conductive probe, numeral 32 a semiconductor substrate disposed in an xy plane, numeral 32a schematically shows the atoms on the surface of the semiconductor substrate, numeral 33 the tunneling current flowing between the probe 31 and the semiconductor substrate 32, numeral 36 a DC bias power supply, numeral 37 a tunneling current detection circuit, numeral 41 a z-axis drive control circuit, numeral 42 an xy-axis drive circuit, numerals 43x, 43y and 43z x-axis, y-axis and z-axis piezoelectric element actuators that drive the probe in the x-axis, y-axis and z-axis, respectively, numeral 44 a controller comprising a processor, storage device and the like, numeral 45 is a control panel for entering operation instructions and setpoints, and numeral 46 is a display device.

When the probe 31 is in a position near the surface of the semiconductor substrate 32, a tunneling current 33 that depends on the voltage applied between the tip of the probe and the atoms 32a in the surface of the semiconductor substrate 32 flows across the vacuum gap as the barrier. Since the fluctuations in the tunneling current 33 are very sensitive to the distance s between the probe 31 and the surface of the semiconductor substrate 32, by detecting fluctuations in the tunneling current with the tunneling current detection circuit 37, fluctuations in the heights above the reference plane of the semiconductor surface can be detected.

The piezoelectric element actuators 43x, 43y and 43z which drive three spatially independent shafts are used for the fine-motion driving and scanning motion driving of the probe 31. By applying a voltage to two electrodes provided on each piezoelectric element (piezo element), the probe 31 is subjected to fine-motion displacement scanning in the x-axis and y-axis directions and fine-motion displacement driving in the z direction (e.g., 0.1 nm/V).

The z-axis drive control circuit 41 accepts feedback input of the output of the tunneling current detection circuit 37 using the tunneling setting from the controller 44 as its setting, thus serving as a feedback drive control circuit that exerts control such that the tunneling current 33 is maintained at the setting. The setting from the controller 44 (the tunneling current setting) corresponds to the set distances of the probe 31 from the surface of the semiconductor substrate, and the output of the z-axis drive control circuit represents a quantity 31s corresponding to the approach position in the z-axis direction to the surface of the semiconductor substrate 32a.

When the probe 31 scans in the direction of the x-axis or y-axis on instruction from the control panel 45, the probe 31 is driven to scan across the surface of the semiconductor substrate at a height matching the state of the surface on an atomic level, as shown by 31s in FIG. 12. The scanning displacement of the probe tip in the x-axis direction and y-axis direction, and the driving displacement in the z-axis direction are acquired, stored and subjected to three-dimensional image processing by the controller 44, so the surface state at the approach position is shown in real time as a three-dimensional image on the display device 46.

Figure 13:
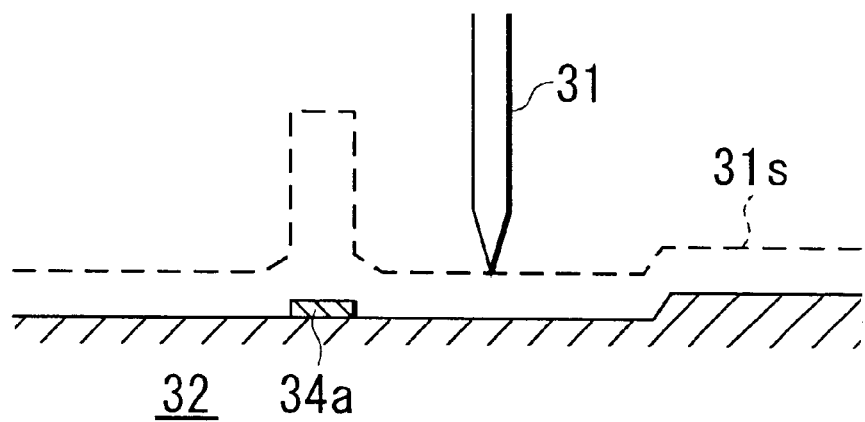
FIG. 13 is an explanatory diagram showing the track of the needle tip in positions near the surface.

FIG. 13 shows the approach position track 31s in the z-axis direction of the probe 31 under conditions that the tunneling current 33 flowing between the probe and the surface of the semiconductor device is to be constant. In fact, the tunneling current also differs depending on the electronic structure at various locations on the semiconductor device, so the approach position of the probe tip in the z-axis direction also differs depending thereon. Note that in the diagram, reference numeral 32 denotes a semiconductor substrate while numeral 34a denotes an electrode provided upon the semiconductor substrate.

Returning to FIGS. 1 and 2, FIG. 1 shows the connection state in the position detection mode of the probe, while FIG. 2 shows the connection, state during measurement mode. Reference numeral 1 denotes a sharp probe (hereinafter referred to simply as a "probe"), numeral 2 a semiconductor substrate disposed with its surface in the xy plane, numeral 3 the tunneling current flowing between the probe 1 and the semiconductor device, numeral 4 a thin metal wire (e.g., a Pt wire several hundred nm wide) which is a semiconductor element, numeral 5 a ground electrode, and numeral 5a an electrode. The ground electrode 5 may also be an electrode contact that is able to be extended outside.

Reference numeral 6 denotes a DC bias power supply, numeral 7 a tunneling current detection circuit, numeral 8 a variable DC bias power supply, numeral 9 is a current detection circuit, numeral 10 a switch where a position detection mode terminal 10t is connected to the tunneling current detection circuit 7 when the measurement prober is in position detection mode while a measurement mode terminal 10m is connected to the current detection circuit 9 when the measurement prober is in measurement mode, numeral 11 a z-axis drive control circuit, numeral 12 an xy-axis drive circuit, numerals 13x, 13y and 13z x-axis, y-axis and z-axis piezoelectric element actuators that drive the probe in the x-axis, y-axis and z-axis, respectively, numeral 14 a controller comprising a processor, storage device and the like, numeral 15 a control panel for entering operation instructions and setpoints, and numeral 16 a display device. (Note that in this Specification, items that are given the same reference number indicate identical or equivalent items.)

Figure 3:
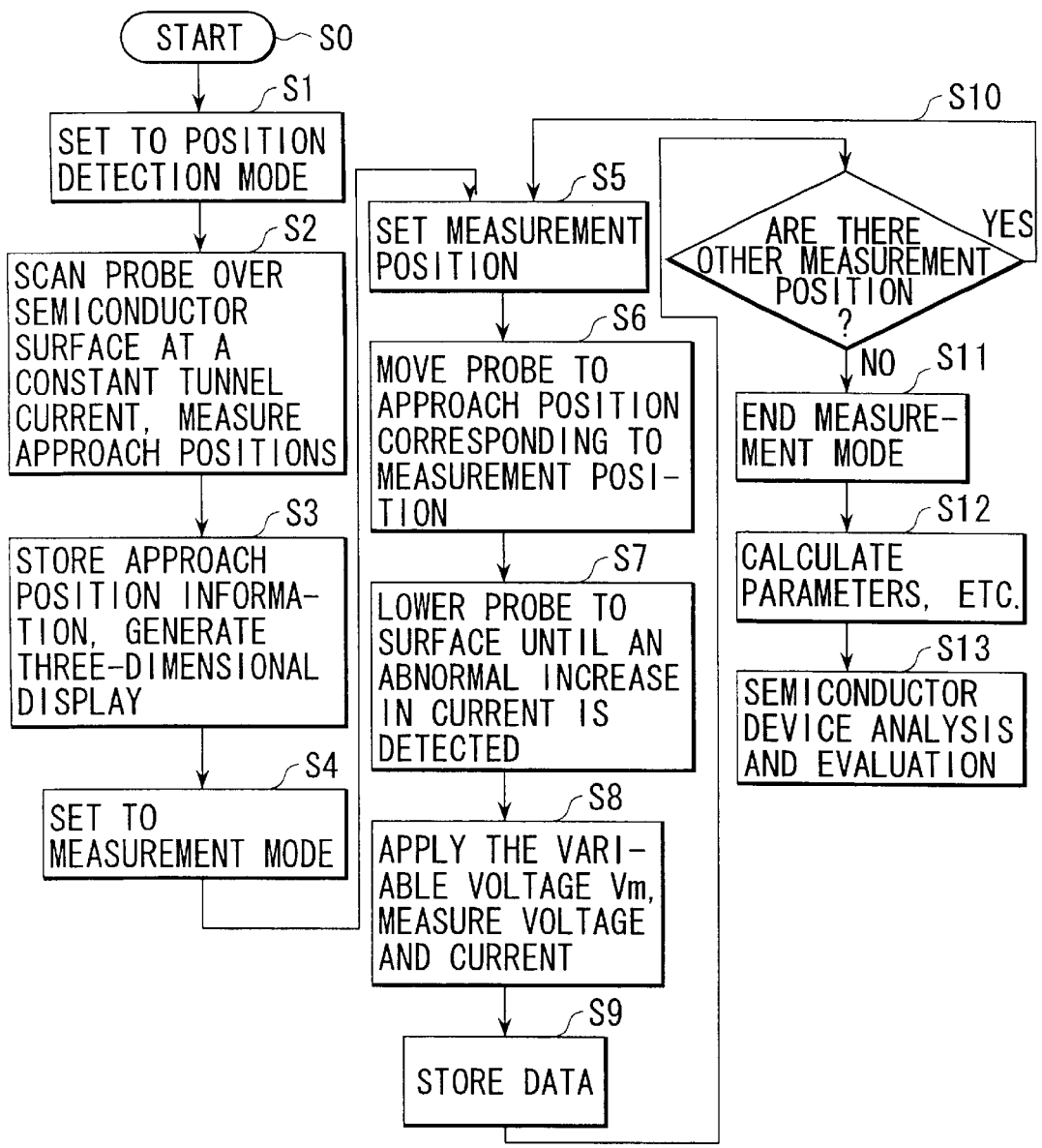
FIG. 3 is a flowchart that shows the measurement procedure for the prober of the present invention.

FIG. 3 is an example of a flowchart of the measurement method by the prober for electrical measurement of the present invention. The measurement method of the present invention comprises two stages, the position detection mode of FIG. 1 and the measurement mode of FIG. 2, with the switching among them performed by the switch 10. In the position detection mode of FIG. 1, the surface approach positions ($x_s$, $y_s$, zs) above the semiconductor device is measured by STM scanning under the constant tunneling current conditions (Step S2), stored in the memory device of the controller 14, and the state of the surface approach position is displayed as a three-dimensional image on the display device 16 (Step S3). Upon the measurement mode settings input from the control panel 15, the switch 10 switches from the position detection mode terminal 10t to the measurement mode terminal 10m, and the prober for electrical measurements switches to measurement mode (Step S4). At this time, the feedback input to the z-axis drive control circuit is halted.

Figure 4:
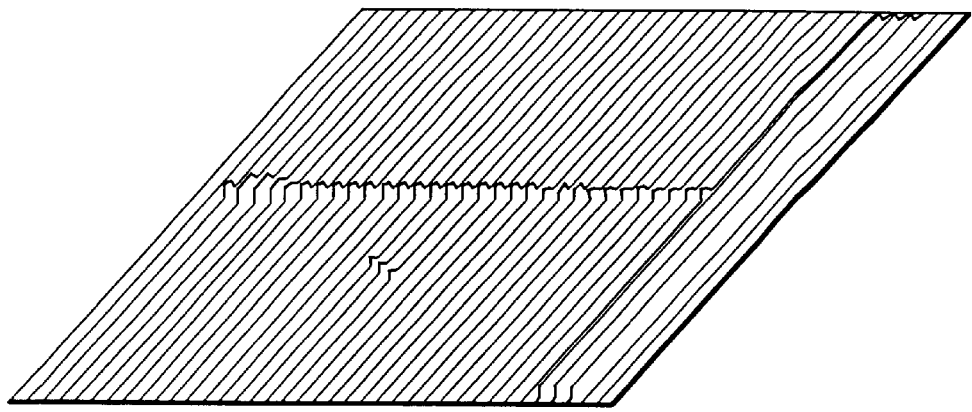
FIG. 4 is a diagram showing a three-dimensional image of the approach position plan detected in the position detection mode of FIG. 1.

FIG. 4 is a three-dimensional image from the STM of FIGS. 1 and 2 displayed on the display device 16. The image of the surface approach positions corresponds to the physical shape and electrical characteristics of the locations on the surface of the semiconductor device. The position (x, y) of the location to be measured is set from the control panel 15 in reference to positions in the image of surface approach positions (e.g., the image of electrode 5a) (Step S5), and the probe is moved to an approach position corresponding to the position of the location to be measured (x, y, $z_s$=j) (Step S6). (However, the [positions] are found by (x, y) interpolation of the surface approach positions ($x_s$, ys, zs) in the vicinity stored in STM scanning.) At the point in time when the probe 1 has moved to the corresponding approach position, the voltage applied to the piezoelectric element actuators 13x and 13y is fixed, namely the scanning position of the probe in the xy plane is fixed.

Next, a voltage is applied to piezoelectric element actuator 13z to cause the probe 1 to approach the surface of the semiconductor device. In this state, when the probe 1 makes electrical contact with the semiconductor device, the current flowing through the probe 1 will increase abnormally, and by detecting this with a current change detector, e.g. a differential current detector, within the variable DC bias power supply 8, the driving of the piezoelectric element actuator 13z is halted and the position of the probe in the z direction is fixed (Step S7). The voltage of the variable DC bias power supply 8 is set to constant or variable and applied to probe 1, while the current and voltage are measured (Step S8).

In order to measure the electrical characteristics of another location on the semiconductor device (Step S10), that location is set with the control panel 15 and the probe 1 is moved to the stored approach position (Step S5), and the current and voltage are measured in the same manner as in the previous measurement. In this manner, it is possible to measure the voltage and current at various locations on the semiconductor device.

Figure 5:
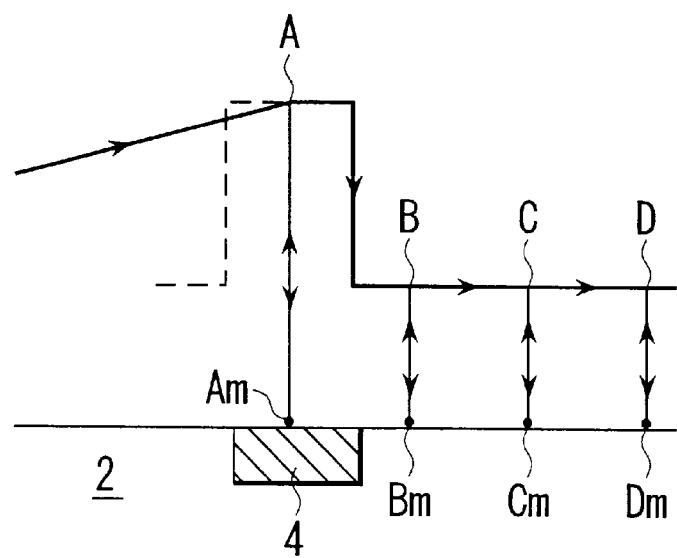
FIG. 5 is a diagram showing a track of the movement of the probe tip in the measurement ode of FIG. 2.

FIG. 5 shows the track of movement of the tip of the probe 1 (solid lines) when moving among measurement points $A_m$, $B_m$, $C_m$, . . . on the semiconductor device. A, B, C . . . are the positions among the surface approach positions of the probe 1 measured during STM scanning that correspond to the measurement points $A_m$, $B_m$, $C_m$, . . . in a plane. The tip of the probe 1 moves via positions in the plane of approach positions corresponding to measurement points and moves to the measurement points. In addition, it is also possible to move from the measurement point $A_m$ to the approach position B corresponding to the next measurement point. Note that the dotted line shows approach positions measured by STM scanning.

Moreover, even without performing the STM operation in advance and storing surface approach position information, it is also possible to position the probe at a surface approach position for each measurement point individually and then make electrical contact with the semiconductor surface and repeat the process of measuring electrical characteristics. Namely, this method of switching the mode at each measurement point can also be used.

Since the electrode 5a is sub-$\mu$m in size, the probes of conventional probe apparatus would also make contact with portions other than the electrode 5a. The gap between the electrode 5a and electrode 5 is also predicted to become sub-$\mu$m in size in the future, so the contact region of the current probes would be larger than the gap between electrode 5a and electrode 5. Therefore, it is necessary to use a sharp probe as in the present apparatus, and probes having a tip radius of not more than 0.02 $\mu$m can be produced with ordinary electropolishing. With such sharp probes, it is possible to measure the current/voltage characteristic between the electrode 5a and the electrode 5 (ground).

When the tip of the probe 1 approaches a stipulated surface location on the semiconductor device, the wave function of the stipulated location extends out from the surface, and by making contact with the wave function, free electrons freely move to the tip of the probe 1. So even if the probe 1 does not make physical contact with the stipulated location on the semiconductor, the probe 1 and the semiconductor achieve continuity. Since there is no mechanical contact, it is possible to measure the current/voltage characteristic of the semiconductor device without damage to the contact locations, electrodes (contacts) or substrate surface of the semiconductor device. In addition, since the abnormal increase in current is detected by a current change detection circuit or differential circuit, the electrical contact of the probe 1 can be detected sensitively on the very outside of the wave function (the position furthest away from the semiconductor device).

In the case of FIG. 2, the electrical contact of the probe 1 to electrode 5a can be detected by detecting the abnormal increase in current with the current detection circuit 9. Next, by scanning the voltage of the variable DC bias power supply 8 from zero, the current/voltage characteristic of the electrode 5a of the thin metal wire 4 is measured directly with the current detection circuit 9.

The electrode 5 connected to the DC bias 6 and current detection circuit 9 need not be connected directly to the thin metal wire 4 which is the semiconductor device as shown in FIGS. 1 and 2, but rather it may be connected to the substrate 2. Even if the probe 1 makes electrical contact with locations of insulation on the semiconductor device, the abnormal increase in the current flowing between the probe 1 and electrode 5a can still be measured. Therefore, the current/voltage characteristic of any stipulated location on the semiconductor device can be measured directly.

Figure 6:
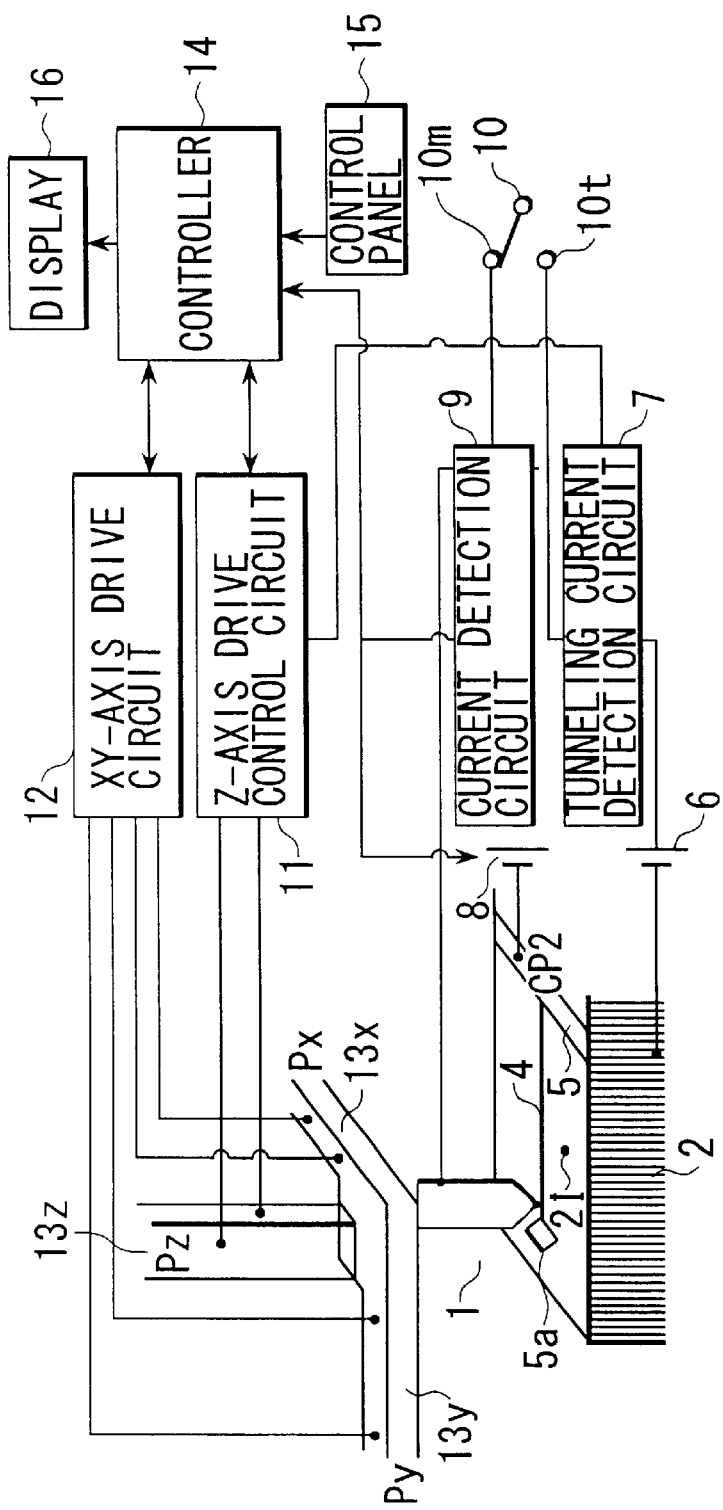
FIG. 6 is a diagram used to explain the Coulomb blockade of the semiconductor device shown in FIGS. 1 and 2.

In the event that ions or the like are present near the thin metal wire 4 of the semiconductor device, then a known phenomenon called Coulomb blockade locally impedes the flow of current in a portion of the thin metal wire. As the electrodes and the like of the semiconductor device become finer, metallic impurities present in the vicinity are expected to result in this Coulomb blockade. FIG. 6 shows the state wherein the Coulomb blockade phenomenon has appeared due to a metal island 2I.

By artificially inducing a Coulomb blockade based on various metal islands, it is possible to measure electrical characteristics in this embodiment and investigate the effects of the thin metal wire 4 on conductivity. By adsorbing specific metals to the tip of the probe 1 with vapor deposition or the like, putting this metal into contact with the surface of the semiconductor device near the thin metal wire 4 and instantaneously applying a high-voltage bias with the variable DC bias power supply, it is possible to form any metal island 2I desired. If one examines he effects of metallic impurities on semiconductor devices as described above, it is possible to analyze and evaluate clearly which kinds of metallic impurities should be paid attention to in order to improve the reliability of a semiconductor device.

Figure 7A:
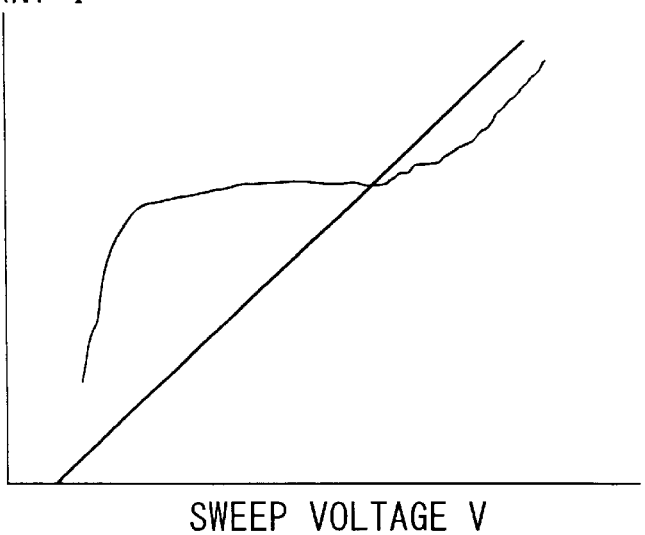
FIG. 7(a) is a graph showing the current/voltage characteristic of a thin metal wire during the Coulomb blockade phenomenon.

Crystal defects can be formed by using the variable DC bias power supply 8 to apply an instantaneous high-voltage pulse to the probe 1 of this apparatus near the surface of the semiconductor device instead of vapor-depositing specific metals. The effects of crystal defects on the conductivity of thin metal wires can also be examined in the same manner as for the metal islands 2I. FIG. 7(a) shows the current/voltage characteristic in the case that the Coulomb blockade phenomenon appears in the electrical characteristics of thin metal wire. It is possible to analyze and evaluate semiconductor devices which have thin metal wires 4 based on this characteristic curve. Note that the straight line shows the current/voltage characteristic in the case in which the Coulomb blockade phenomenon is not present.

Figure 8:
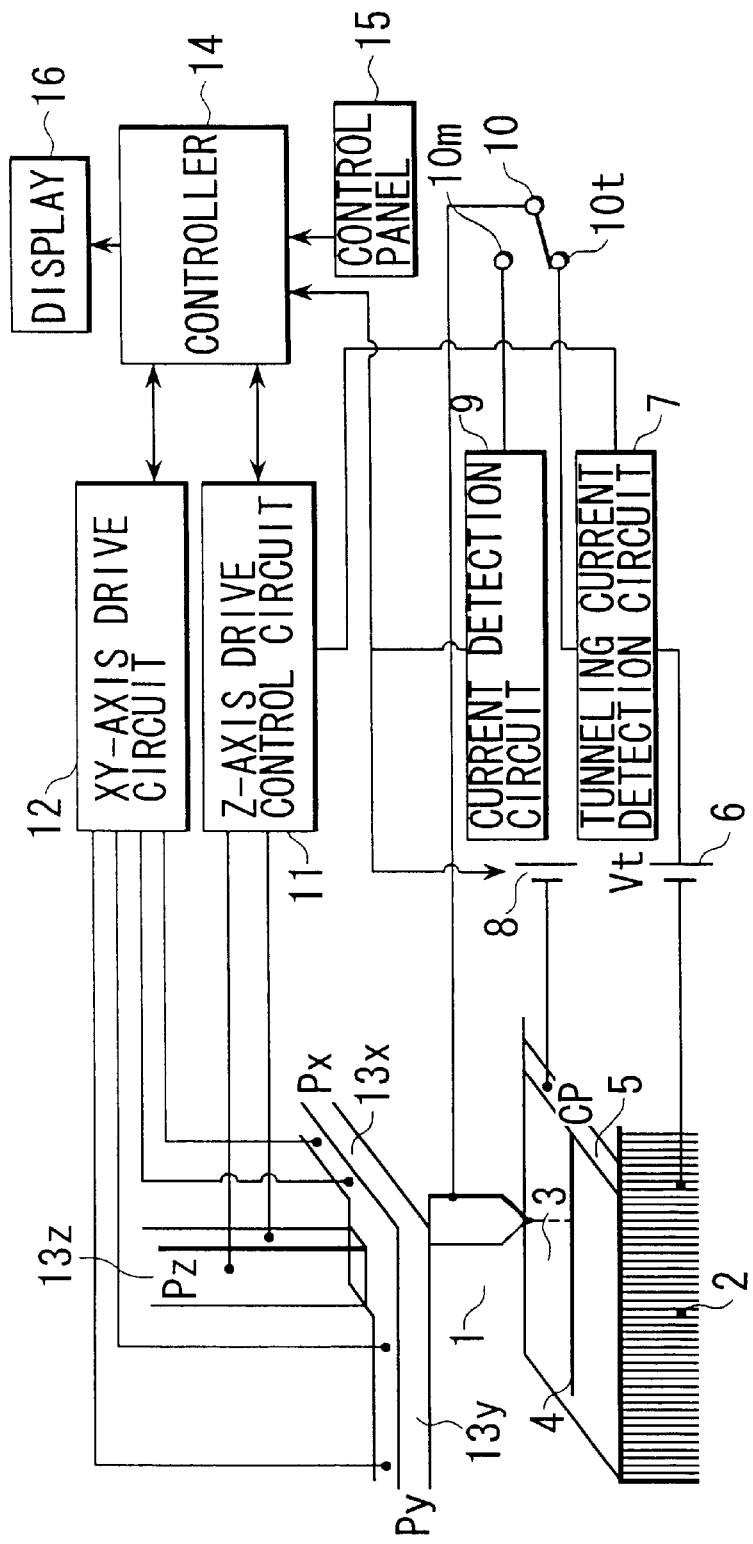
FIG. 8 is a diagram used to explain the position detection mode of the prober according to the present invention on another semiconductor device.
Figure 9:
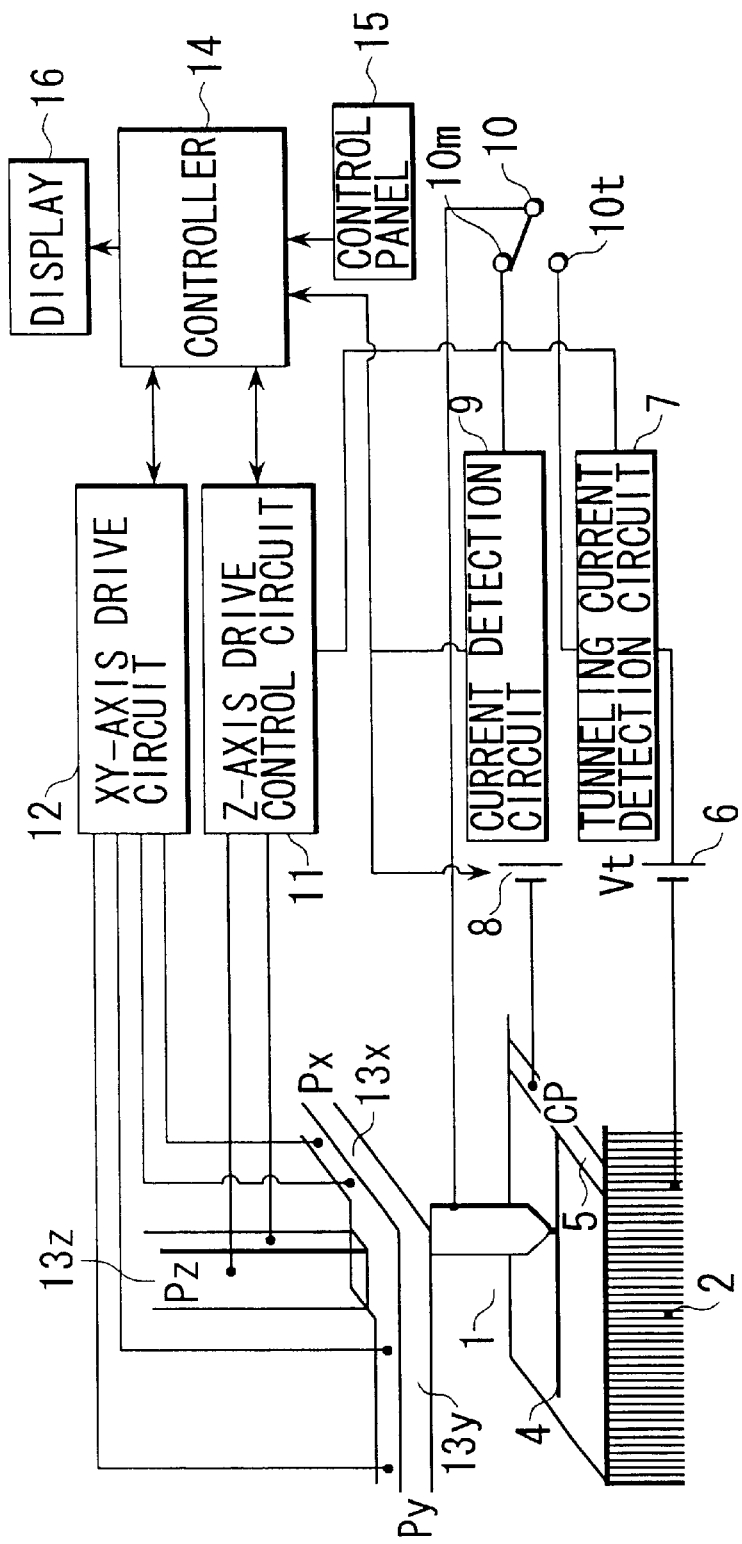
FIG. 9 is a diagram used to explain the measurement mode of the prober of FIG. 8.
Figure 10:
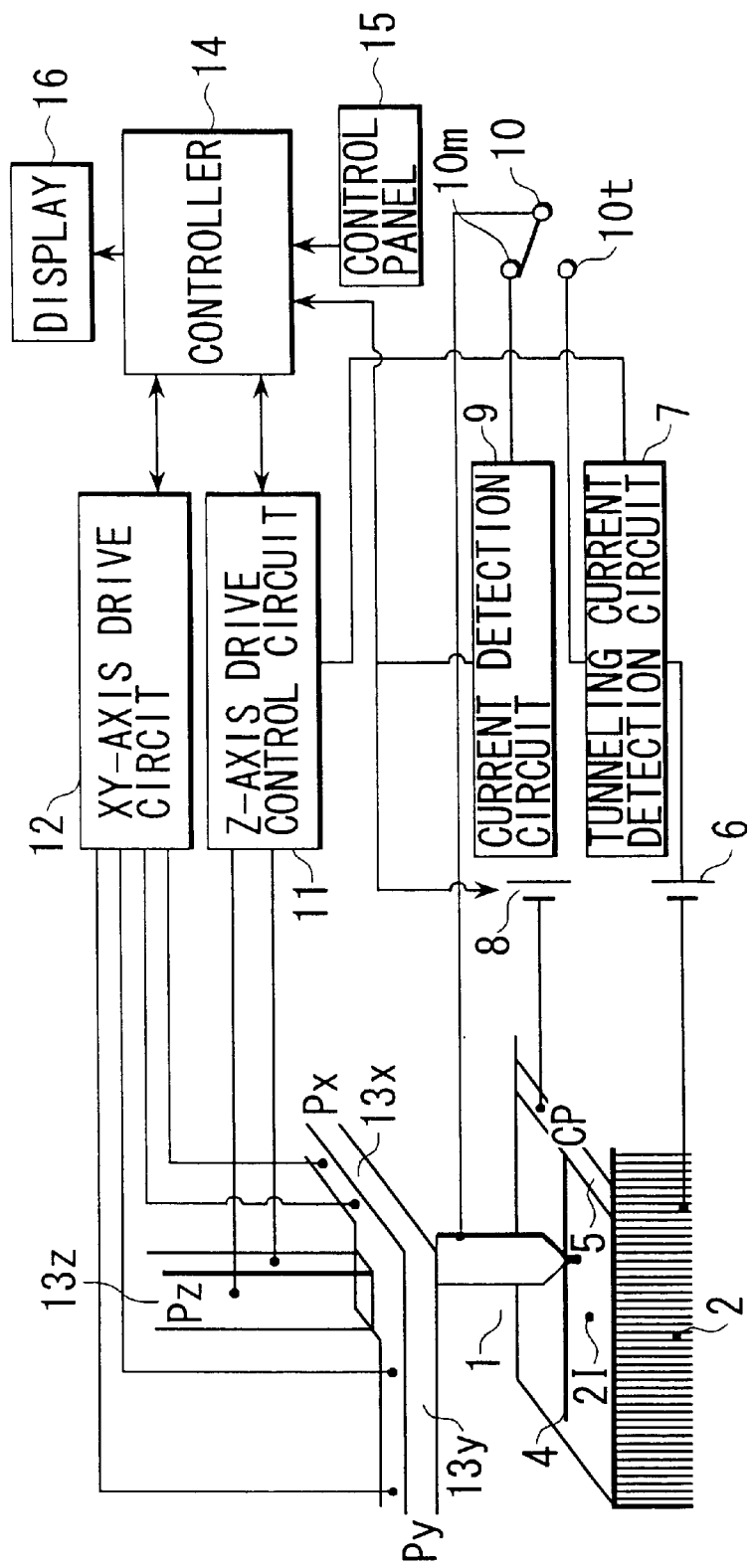
FIG. 10 is a diagram used to explain the Coulomb blockade of the semiconductor device shown in FIGS. 8 and 9.

FIGS. 1 and 2 show an example of measuring the electrical characteristics of a semiconductor device provided with an electrode, but FIGS. 8–10 show an example of measuring the electrical characteristics of semiconductor devices without electrodes, with FIG. 8 being an example of the connections in position detection mode and FIG. 9 being an example of connections in measurement mode. This embodiment shows a semiconductor device with one thin metal wire 4. The embodiment of FIGS. 8–10 is used to describe examining the internal structure of a semiconductor device not only its electrodes. Since the probe 1 can be moved to any location on the surface of a semiconductor device, it is possible to examine the change in current as a function of the distance along the thin metal wire 4 to the probe position, for example.

Since the piezoelectric element actuators 13x, 13y and 13z can be moved with an accuracy of 0.10 nm, positioning even at the position of the thin metal wire 4 to nm-order accuracy is possible as shown in FIG. 9. Positioning in the z direction is possible at 0.1 nm precision, so the probe 1 and thin metal wire 4 can be put into electrical contact without damaging the thin metal wire 4. The fact that the thin metal wire 4 is a so-called quantum thin wire can be confirmed by the functional relationship in that the conductivity which increases exponentially within a coherent distance becomes constant at positions where this distance is exceeded.

In this manner, it is possible to measure electrical characteristics that set foot on the internal structure within the semiconductor device. Quantum effects that conventionally were not a problem begin to appear with such fine structures, so when fine metal electrodes are used in simulations used for the fabrication of semiconductor devices, it is possible to determine directly how to change the handling of their conductivity depending on their size.

Figure 7B:
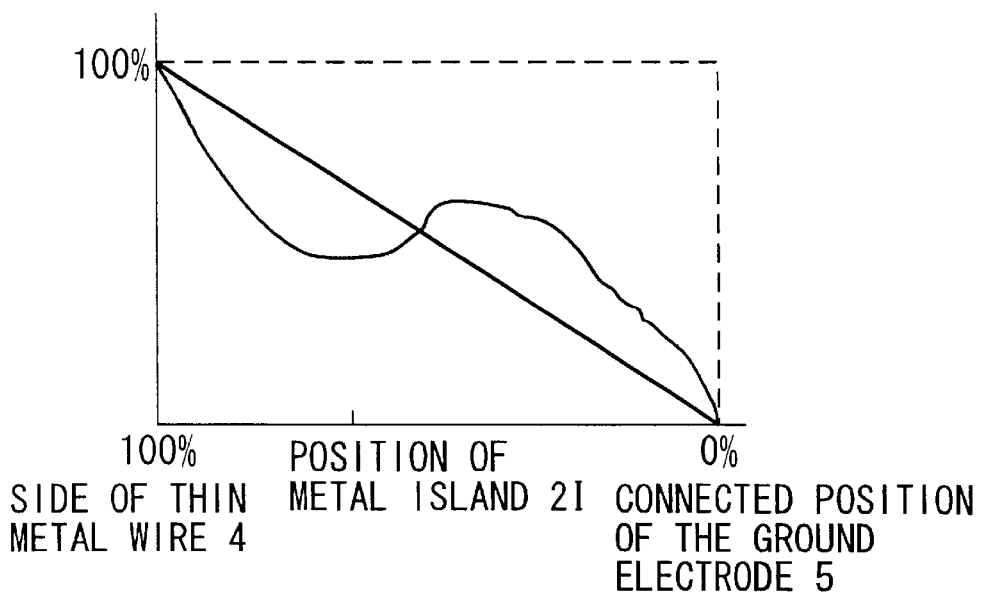
FIG. 7(b) is a graph showing the potential distribution of a thin metal wire during the Coulomb blockade phenomenon.

Here follows an explanation of the measurement of the potential and other characteristics other than conductivity. FIG. 10 shows the state wherein the Coulomb blockade phenomenon occurs in the semiconductor device shown in FIGS. 8 and 9, and this figure is nearly identical to that shown in FIG. 6. The effects of metallic impurities were examined using the current between electrodes in the example of FIG. 6, but in the example of FIG. 10, the effects of impurities are examined using the potential in the vicinity of the metal island 2I. The means of forming the metal island 2I is to be identical. While a localized potential distribution is thought to occur in the vicinity of the metal island 2I, as shown in FIG. 10, by bringing the probe 1 into direct electrical contact with the semiconductor surface although not above the thin metal wire 4, and varying the voltage of the variable DC bias power supply 8, the voltage at which the detection current of the current detection circuit 9 becomes zero is found. This voltage is the potential at that position. By mapping the potential in two dimensions, it is possible to examine the potential distribution in the vicinity of the metal island 2I. FIG. 7(b) shows the potential distribution in the thin metal wire 4 when the Coulomb blockade phenomenon is caused by the metal island 2I, so the potential is at 100% at the side of the thin metal wire 4, roughly 50% at the position of the metal island 2I and 0% at the connected position of the ground electrode 5.

By examining the effects of metallic impurities on semiconductor devices which could not be examined conventionally, it is possible to analyze and evaluate clearly how any kind of metallic impurity can disturb the operating conditions of the semiconductor device. The potential distribution can be also similarly examined on semiconductor devices that are operating normally, so the direct electrical examination of structures in the interior of the device is possible.

In addition, by slightly displacing the probe 1 in the x-axis and y-axis directions around point A of FIG. 5, thus performing a fine-scale measurement of measurement points around measurement point $A_m$, the potential of the conductor (electrode) will be markedly different from the potential of the substrate in the vicinity of the electrode, so it is possible to measure the size of the conductor (electrode) from the potential distribution.

Figure 11:
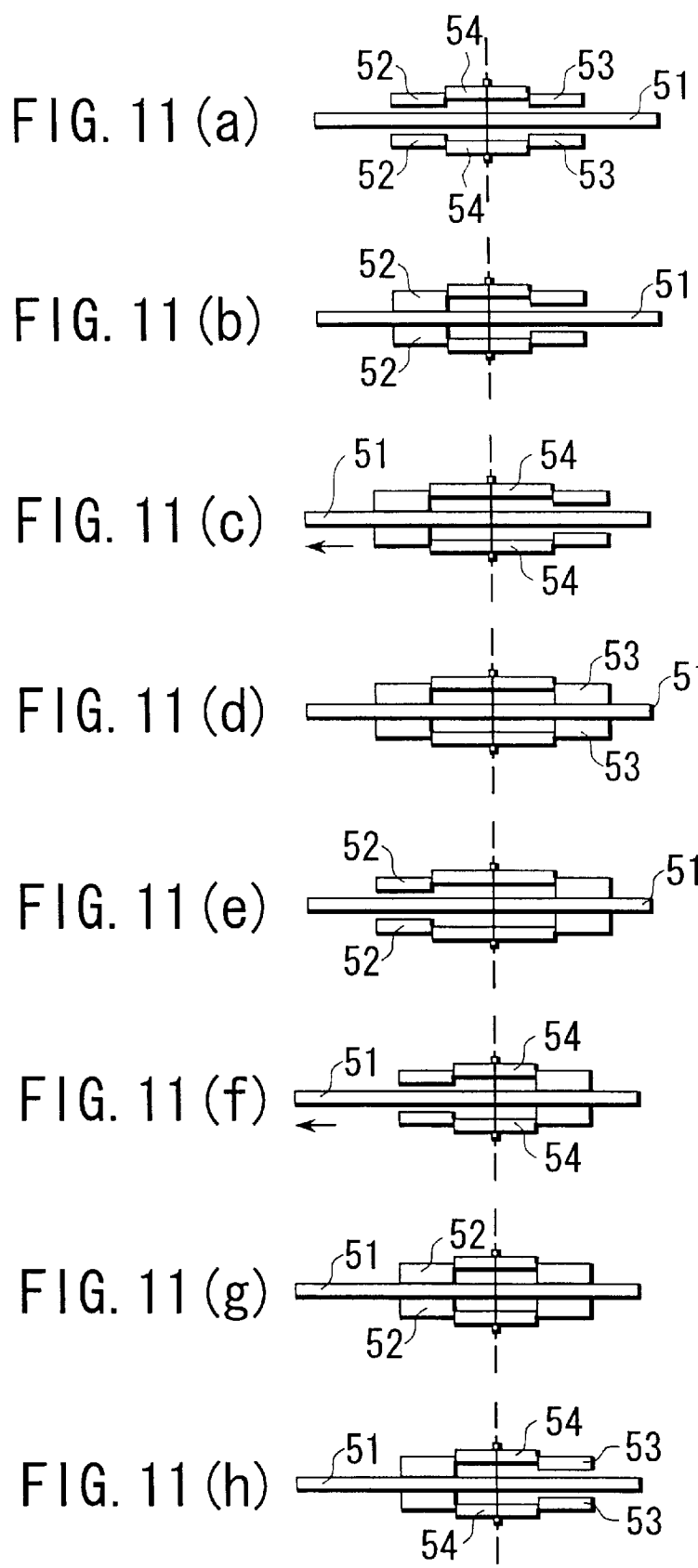
FIG. 11 is a diagram used to explain the principle of the inchworm drive mechanism for the probe.

In this embodiment, piezoelectric element actuators were used to drive the probe 1 but it is also possible to use any means which can perform scanning on an atomic order (nm order), such as an inchworm drive or the like. FIG. 11 shows the drive mechanism of an inchworm (one axial direction only). An inchworm drive is a mechanism combining a piezoelectric element for elongation and contraction with clamping elements, thereby moving the probe 1 in the manner of an inchworm.

In FIG. 11, reference numeral 51 denotes a drive shaft for driving the probe in one direction, while numerals 52 and 53 denote clamp elements and numeral 54 denotes a piezoelectric element with a fixed central portion. FIG. 11(a) shows the state prior to the start of operation of the inchworm drive mechanism. FIG. 11(b) shows the state wherein the drive shaft 51 is clamped by one of the clamp elements 52. FIG. 11(c) shows the state wherein the piezoelectric element 54 is elongated. FIG. 11(d) shows the state wherein the drive shaft 51 is clamped by the other of the clamp elements 53. FIG. 11(e) shows the state wherein the clamping of clamp element 52 is released. FIG. 11(f) shows the state wherein the piezoelectric element 54 is compressed, moving the drive shaft 51 to the left. FIG. 11(g) shows the state wherein clamp element 52 is clamped. FIG. 11(h) shows the state wherein the clamping of clamp element 53 is released. When the piezoelectric element 54 is further elongated, the drive shaft 51 moves further to the left. In this manner, the drive shaft can be moved in nm increments.

Instead of using the tunnel current to scan along the surface of the semiconductor device and detect and store positions, it is possible to use interatomic forces, temperature or light to detect electrical contact with the surface of the semiconductor device.

Figure 14:
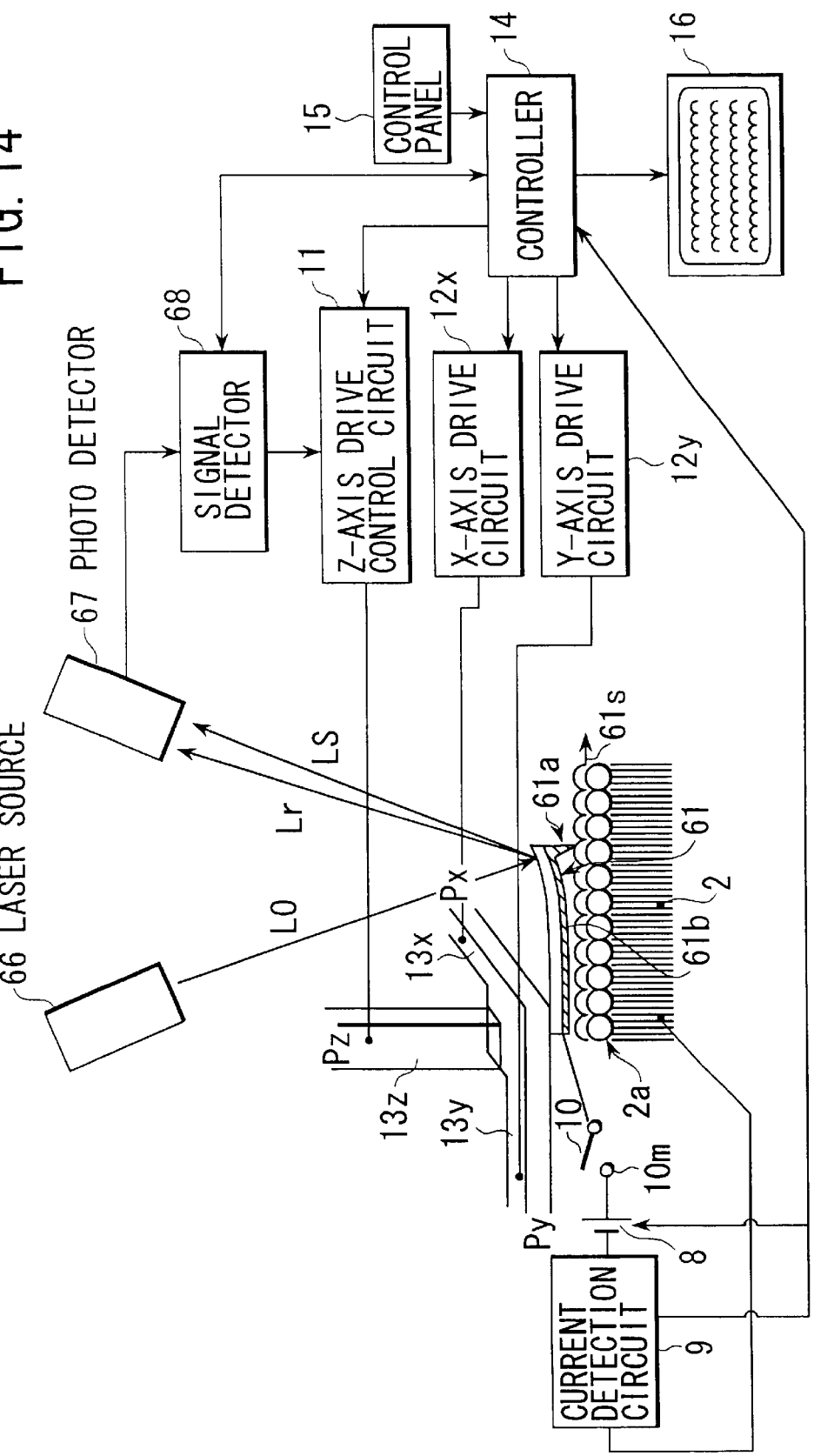
FIG. 14 is a diagram used to explain an apparatus that utilizes interatomic forces to measure the electrical characteristics of a semiconductor surface.

FIG. 14 illustrates the principle of an embodiment wherein interatomic forces are utilized to detect electrical contact at a semiconductor surface position. A protrusion (probe) 61a (0.02 $\mu$m or smaller) is present on the tip of a cantilever 61 that is able to detect minute forces, and the cantilever 61 is distorted as shown in the figure by the interatomic forces that act between this protruding portion 61a and the surface of the semiconductor surface. This distortion of the cantilever causes the direction of reflection of the light L0 emitted from a laser source 66 to change from Ls to Lr. The light is received by a photodetector 67, and the change in the direction of reflection of light is converted to interatomic force by the displacement signal detector 68. When the cantilever protrusion 61a approaches to near contact with the surface of the semiconductor device, first an attraction mode occurs wherein it is pulled to the atoms 2a of the semiconductor surface and upon a closer approach a repulsion mode occurs due to the repulsion from the atoms 2a of the semiconductor surface. This state is quite similar to the process undergone in the scattering of rigid spheres, so if one considers the instant of scattering to be contact, the surface contact can be detected from the instant when the forces on the cantilever 61 change from attraction to repulsion. The position of surface contact can be measured by scanning with a drive mechanism similar to that of the apparatus of FIG. 1, stored in the storage device of controller 14, subjected to image processing and displayed on the display device 16.

In measurement mode, the cantilever 61 is positioned at the stipulated position by a controller as in FIG. 1, the switch puts measurement mode terminal 10m into the closed state, and the prober measurement circuit is formed by the semiconductor 2 (or electrode), variable DC bias power supply 8, current detection circuit 9, measurement mode terminal 10m and the conductor layer 61b of the cantilever 61. The voltage of the variable DC bias power supply 8 is applied between the cantilever and semiconductor (or electrode) and the current is detected, so the electrical characteristics of the semiconductor can be directly measured in the same manner as in FIG. 2.

Figure 15:
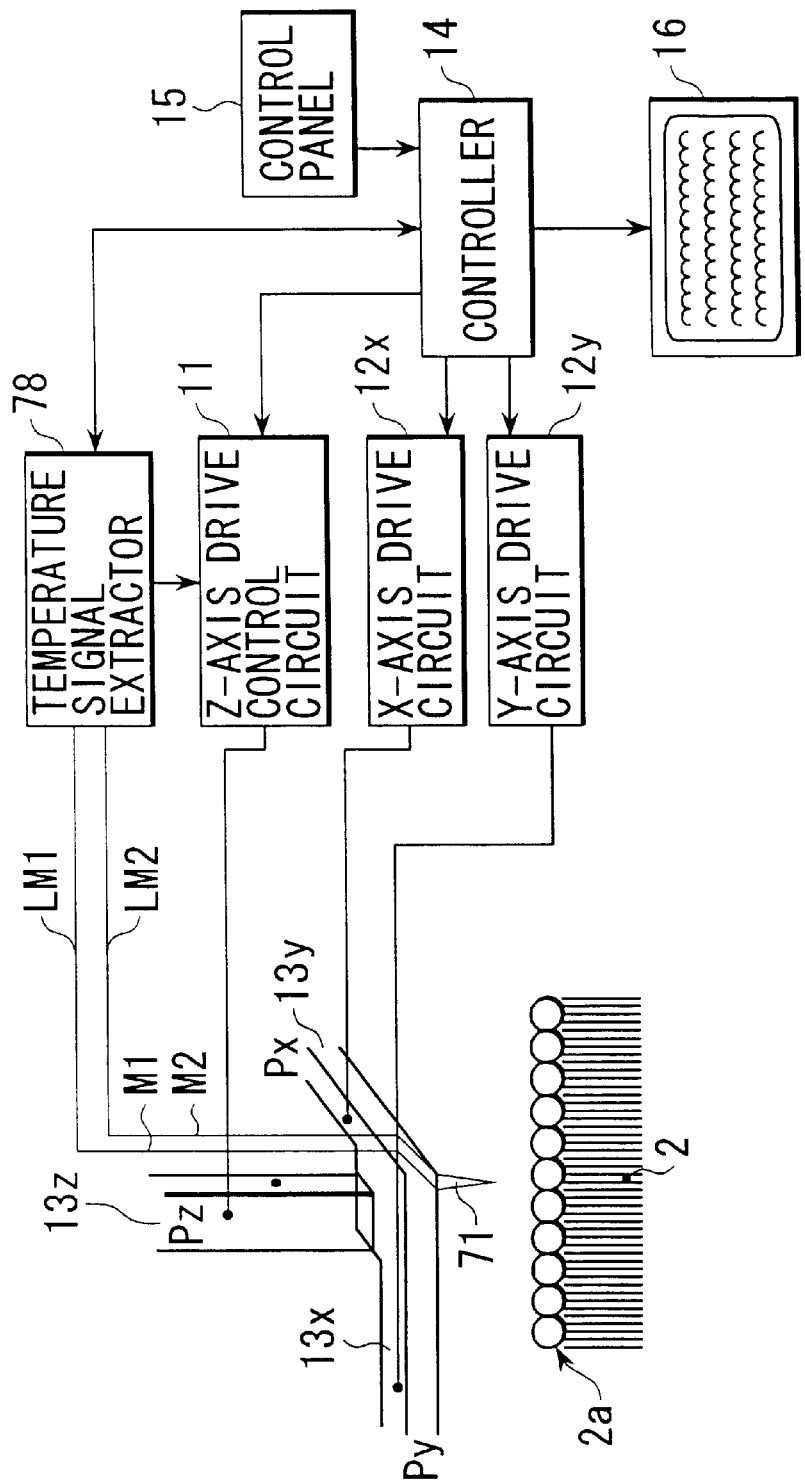
FIG. 15 is a diagram used to explain the method of utilizing light to detect contact with a seniconductor surface.

FIG. 15 illustrates the principle of an embodiment wherein temperature is utilized to detect a semiconductor surface. In this case, a sensor made from a bimetal of two different types of metal M1 and M2 welded together and given a sharp tip (0.02 m or less) by electropolishing or the like is used as the probe 71, and compensating conductors LM1 and LM2 lead the potentials of the two metals to a temperature signal extractor 78 which measures the difference between the two potentials and converts it to a temperature. When the tip of this sensor 71 contacts the semiconductor surface, the detected temperature will rapidly change to the temperature of the semiconductor surface, so surface contact can be detected in this case also.

Figure 16:
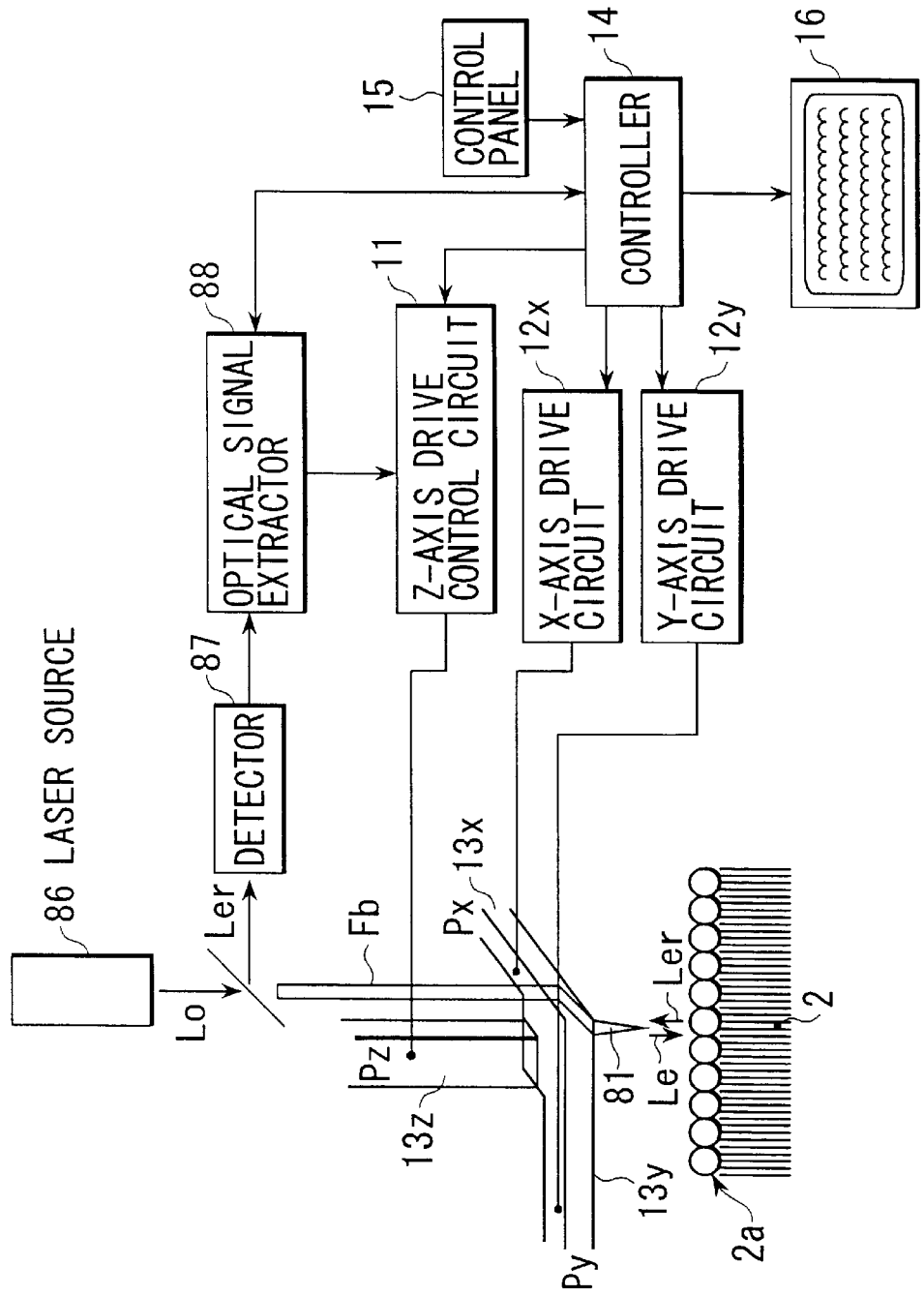
FIG. 16 is a diagram used to explain the method of utilizing temperature to detect contact with a semiconductor surface.

FIG. 16 illustrates the principle of an embodiment wherein light is utilized to detect contact with a semiconductor surface. An optical fiber with a sharpened tip is used as the sensor 81. In order to limit the areas where light can pass to only the sharp area at the tip, all other areas are shut off to light with metal or the like. While the resolution of measurement with light is normally determined by the wavelength, in this state it is determined by the shape of the sharp tip of the optical fiber. Evanescent light (near-field light) is sensitive to the dielectric constant of the optical fiber tip.

Light that is emitted from a laser source 86 passes through the fiber and becomes evanescent light Le which senses the dielectric field at the tip, becoming reflected light Ler which returns through the fiber and is detected by the detector 87, so that a signal is detected by the optical signal extractor 88. Therefore, the dielectric field will change rapidly when the fiber tip Tp comes in contact with the surface of the semiconductor surface, so contact can be detected.

The contact position on the semiconductor surface in FIGS. 15 and 16 is measured by scanning with the same kind of drive mechanism as in FIG. 1, acquired and stored by the controller 14 and displayed as a three-dimensional image on the display device 16. Moreover, in measurement mode, a conductor layer is applied to the sensors 71 and 81 in the same manner as the device of FIG. 14, the conductor (electrode), variable DC bias power supply, current detection circuit and measurement mode switch assumes the closed state, and the connected measurement mode terminal forms an electrical characteristic measurement circuit of the cantilever conductor layer, so the electrical characteristics of the semiconductor device can be measured directly in the same manner as in FIG. 14.

With the prober for electrical measurement and measurement method therefor, positioning is performed using information on the semiconductor device surface based on surface position data for the semiconductor, and a sharp probe can be put in direct contact with the semiconductor surface without damaging the surface of the semiconductor, so the direct measurement of potential in the interior of ultra-fine semiconductor devices and semiconductor devices becomes possible. Thereby the calculation of various parameters required for simulation is possible and it is possible to find optimal parameters as well as evaluate semiconductor devices.

What is claimed is:

1. A prober for measuring electrical characteristics of a semiconductor device, comprising:

contact means having a contactor with a sharp tip provided at a position close above a position of the semiconductor device at which the electrical characteristics are to be measured, drive means for driving said contact means in the direction of the x-, y- and z-axes on the nm order , an x- and y-axis drive circuit that supplies drive current to said drive means for driving said contact means in the direction of the x- and y-axes, signal supply means for supplying a signal between a surface of the semiconductor device and said contact means, detection means for detecting the signal from said supply means and providing an output signal indicative of at least one of voltage current and potential information in said semiconductor device, a z-axis drive control circuit that supplies drive current to said drive means for driving said contact means in the x-axis direction by using the output signal from said detection means as a feedback input signal, a circuit for providing output to the z-axis drive control circuit of a signal that halts the driving of said contact means in the z-axis direction upon detection by said detection means of an abnormal signal indicating that said contact means is in electrical contact with said semiconductor device, a switch that connects said contact means to said detection means, a controller that supplies signals for-driving said contact means in the x, y- and z-axis directions, preset tunneling current signals for said z-axis drive control circuit and preset voltage signals for variable DC bias voltage of said detection means, acquires and stores x, y and z positional information for said contact means along with said at least one of voltage, current and potential information from said detection means, and performs image processing on said information, and a display device that displays said information and image information.

2. The prober according to claim 1, wherein said contact means is a probe with a tip radius of not more than 0.02 μm.

3. The prober according to claim 1, wherein said drive means for driving said contact means is a piezoelectric element actuator.

4. The prober according to claim 1, wherein said drive means for driving said contact means is an inchworm drive.

5. The prober according to claim 1, wherein the signal supply means for supplying a signal between the surface of said semiconductor device and said contact means is a means of applying a tunnel current between the surface of said semiconductor device and said contact means, and the detection means for detecting the signal from said supply means is a detection circuit for detecting the applied current.

6. A method of measuring electrical characteristics of a semiconductor device using a prober having a sharp probe for electrical measurement, comprising the steps of:

causing the sharp probe to scan on the nm order near a surface of the semiconductor device while supplying a signal onto the surface of the semiconductor device to detect data of the signal, positioning said probe, based on the detected data, at a semiconductor surface approach position corresponding to a desired position on the semiconductor surface, driving said probe downward in the z-axis direction toward the semiconductor surface until an abnormal increase in current flowing through said probe indicating that the probe is in electrical contact with the semiconductor surface, applying a voltage to said probe with the probe in electrical contact with the semiconductor surface to directly measure at least one of current and voltage in the semiconductor device at the desired position.

7. The method according to claim 1, wherein said probe is driven on the nm order by a piezoelectric element actuator.

8. The method according to claim 1, wherein said probe is driven on the nm order by an inchworm drive.

9. The method according to claim 1, further comprising the steps of applying a tunneling current between said probe and said semiconductor device and detecting current fluctuation to position said probe at a desired position.

\* \* \* \* \*